United States Patent
Liu et al.

(10) Patent No.: US 12,003,879 B2
(45) Date of Patent: Jun. 4, 2024

(54) PIXEL UNIT AND SIGNAL PROCESSING METHOD FOR PIXEL UNIT

(71) Applicant: Peking University, Beijing (CN)

(72) Inventors: Xiaoyan Liu, Beijing (CN); Liqiao Liu, Beijing (CN); Gang Du, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 276 days.

(21) Appl. No.: 17/610,002

(22) PCT Filed: Jun. 25, 2021

(86) PCT No.: PCT/CN2021/102394
§ 371 (c)(1),
(2) Date: Nov. 9, 2021

(87) PCT Pub. No.: WO2022/095474
PCT Pub. Date: May 12, 2022

(65) Prior Publication Data
US 2022/0353451 A1 Nov. 3, 2022

(30) Foreign Application Priority Data
Nov. 6, 2020 (CN) .......................... 202011232475.5

(51) Int. Cl.
*H04N 25/77* (2023.01)
*H01L 27/146* (2006.01)
(Continued)

(52) U.S. Cl.
CPC ....... *H04N 25/77* (2023.01); *H01L 27/14603* (2013.01); *H04N 25/53* (2023.01); *H04N 25/709* (2023.01); *H04N 25/79* (2023.01)

(58) Field of Classification Search
CPC .......................... H01L 27/14603; H04N 25/53; H04N 25/702; H04N 25/709; H04N 25/77; H04N 25/79
See application file for complete search history.

(56) References Cited

U.S. PATENT DOCUMENTS 10,097,781 B2    10/2018  Kim
2002/0009824 A1*  1/2002  Maeda .............. H01L 27/14603
                                                    438/73
(Continued)

FOREIGN PATENT DOCUMENTS

CN    103685989 A    3/2014
CN    108666336 A    10/2018
(Continued)

OTHER PUBLICATIONS

Chinese Office Action dated Jul. 14, 2021 issued in CN 202011232475.5.
(Continued)

*Primary Examiner* — Amy R Hsu
(74) *Attorney, Agent, or Firm* — Scully, Scott, Murphy & Presser, P.C.

(57) ABSTRACT

The present application discloses a pixel unit and a signal processing method for a pixel unit. The pixel unit includes at least one pixel, and the pixel includes: an N-type main pixel, a P-type main pixel, and a sub-pixel; and the sub-pixel is located between the N-type main pixel and the P-type main pixel; or the pixel includes at least a first pixel and a second pixel that are adjacent to each other; the first pixel includes an N-type main pixel, and the second pixel includes a P-type main pixel; the first pixel and the second pixel share one sub-pixel; the sub-pixel is configured to generate and output a signal difference between the N-type main pixel and the P-type main pixel according to the current. By adding a sub-pixel between two main pixels, the sub-pixel generates and outputs the signal difference between the N-type main pixel and the P-type main pixel according to the current sent by the two main pixels, so that the received signal can be efficiently processed directly to reduce the amount of output (Continued)

data. Since there is no need to increase a circuit, the pixel area will not increase due to a complicated circuit.

16 Claims, 3 Drawing Sheets

(51) Int. Cl.
*H04N 25/53* (2023.01)
*H04N 25/709* (2023.01)
*H04N 25/79* (2023.01)

(56) References Cited

U.S. PATENT DOCUMENTS

| | | | | |
|---|---|---|---|---|
| 2010/0133596 | A1* | 6/2010 | Terakawa | H01L 27/14609 |
| | | | | 257/292 |
| 2015/0312461 | A1* | 10/2015 | Kim | H01L 27/14627 |
| | | | | 348/308 |
| 2017/0339359 | A1 | 11/2017 | Kim | |
| 2019/0131326 | A1* | 5/2019 | Kim | H01L 27/1461 |
| 2020/0137338 | A1 | 4/2020 | Ohshitanai | |

FOREIGN PATENT DOCUMENTS

| | | |
|---|---|---|
| CN | 112584068 A | 3/2021 |
| FR | 2982079 A1 | 5/2013 |

OTHER PUBLICATIONS

International Search Report dated Sep. 28, 2021 issued in PCT/CN2021/102394.
Liu, Liqiao et al., "Structure Optimization for UTBB Based Image Sensor to Suppress Crosstalk", 2018 14th IEEE International Conference on Solid-State and Integrated Circuit Technology (ICSICT).
Wang, Yangyuan et al., "32nm and below technology node CMOS technology new process and new structure devices", Science in China Press (2008), pp. 921-932, with English-language Abstract.

* cited by examiner

PIXEL UNIT AND SIGNAL PROCESSING METHOD FOR PIXEL UNIT

TECHNICAL FIELD

The present application relates to the field of photodetectors, and in particular to a pixel unit and a signal processing method for a pixel unit.

BACKGROUND

Image sensing and processing systems are widely used in production and life, especially in fields such as facial recognition, security monitoring, and autonomous driving. In current mainstream image sensing and processing systems, an imaging function is completed by image sensors such as CMOS-APS optoelectronic devices, and the complete image data is transmitted to an image signal processor for processing. As the imaging quality of image sensors continues to improve, the amount of original image data generated by the image sensors continues to increase. For applications such as intelligent visual recognition, there is a large amount of information redundancy in the original image data, which brings tremendous pressure for data transmission and processing and leads to unnecessary delay and power consumption for data transmission and processing of the system. At the same time, the demand for high-speed and low-power image processing in edge computing, Internet of Things and other fields is becoming higher and higher, and a more efficient image sensing and processing system is required.

By designing a corresponding pre-processing circuit at the pixel array level, the original image signal can be processed in real time, so as to perform feature extraction and information filtering on the original images, and reduce data transmission and the calculation amount of an image processing unit. At present, some image preprocessing schemes mainly include adding various functional circuits in or around the pixels, such as comparators, convolution calculation circuits, etc., so that the pixel signals can be processed timely, and redundant data is filtered out, so that only meaningful data is input into the image processing unit for further processing, thereby reducing the time cost and energy consumption required for calculation, and improving an operating efficiency of the entire system. However, adding a pre-processing circuit at the pixel level makes the circuit complex and will increase the pixel area.

In summary, there is a need to provide a pixel unit and a signal processing method for a pixel unit, which can perform efficient image processing in sensors without increasing the pixel area and having a low circuit complexity.

SUMMARY

In order to solve the above problem, the present application proposes a pixel unit and a signal processing method for a pixel unit.

In a first aspect, the present application proposes a pixel unit including at least one pixel; and the pixel includes: an N-type main pixel, a P-type main pixel, and a sub-pixel;
both the N-type main pixel and the P-type main pixel are configured to output a current corresponding to an exposure intensity to the sub-pixel according to exposure; and
the sub-pixel is located between the N-type main pixel and the P-type main pixel, and is configured to generate and output a signal difference between the N-type main pixel and the P-type main pixel according to the current.

In a second aspect, the present application proposes a pixel unit, which includes at least a first pixel and a second pixel that are adjacent to each other; the first pixel includes an N-type main pixel, and the second pixel includes a P-type main pixel; the first pixel and the second pixel share one sub-pixel;
both the N-type main pixel and the P-type main pixel are configured to output a current corresponding to an exposure intensity to the sub-pixel according to exposure; and
the sub-pixel is configured to generate and output a signal difference between the N-type main pixel and the P-type main pixel according to the current.

Preferably, the N-type main pixel, the P-type main pixel and the sub-pixel all include an N-type MOS transistor structure, a buried oxide layer and a substrate.

Preferably, the N-type MOS transistor structure includes: an N-type MOS transistor source region, an N-type MOS transistor channel region, and an N-type MOS transistor drain region.

Preferably, a thickness of a silicon film in the N-type MOS transistor channel region is 5 nanometers to 20 nanometers.

Preferably, lengths of the N-type MOS transistor source region and the N-type MOS transistor drain region are 20 nanometers to 90 nanometers.

Preferably, a thickness of the buried oxide layer is 10 nanometers to 30 nanometers.

Preferably, the substrate in the N-type main pixel is an N-type doped well, and the substrate in the P-type main pixel is a P-type doped well.

Preferably, shallow trench isolation is used for isolation between the N-type main pixel, the P-type main pixel and the sub-pixel.

In a third aspect, the present application proposes a signal processing method for a pixel unit, in which the above-mentioned pixel unit is used, the method including the following steps:
applying a positive voltage to the N-type main pixel in the pixel unit, and applying a negative voltage to the P-type main pixel;
exposing the pixel unit;
outputting, by the N-type main pixel and the P-type main pixel, a current corresponding to an exposure intensity to the sub-pixel according to the exposure; and
generating and outputting, by the sub-pixel, a signal difference between the N-type main pixel and the P-type main pixel according to the current.

The present application has the following advantages: by adding a sub-pixel between two main pixels, the sub-pixel generates and outputs the signal difference between the N-type main pixel and the P-type main pixel according to the current sent by the two main pixels, so that the received signal can be efficiently processed directly to reduce the amount of output data. Since there is no need to increase a circuit, the pixel area will not increase due to a complicated circuit.

BRIEF DESCRIPTION OF THE DRAWINGS

Upon reading the detailed description of preferred embodiments below, various other advantages and benefits will become clear to those skilled in the art. The drawings are only used for the purpose of illustrating the preferred embodiments, and should not be considered as a limitation to the present application. Moreover, throughout the drawings, identical components are denoted by identical reference signs. In the drawings.

DETAILED DESCRIPTION

Figure 1:
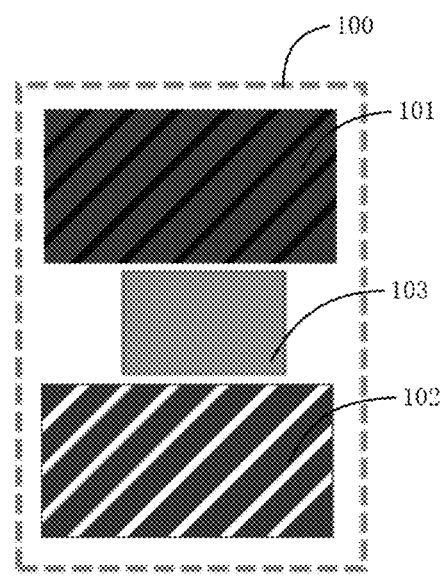
FIG. 1 is a schematic diagram of a pixel unit provided by the present application.

Hereinafter, exemplary embodiments of the present disclosure will be described in greater detail with reference to the accompanying drawings. Although the exemplary embodiments of the present disclosure are shown in the drawings, it should be understood that the present disclosure may be implemented in various forms and should not be limited by the embodiments set forth herein. On the contrary, these embodiments are provided to enable a more thorough understanding of the present disclosure and to fully convey the scope of the present disclosure to those skilled in the art.

According to the embodiment of the present application, a pixel unit is proposed; as shown in FIG. 1, the pixel unit includes at least one pixel 100, and the pixel 100 includes: an N-type main pixel 101, a P-type main pixel 102, and a sub-pixel 103.

Both the N-type main pixel 101 and the P-type main pixel 102 are configured to output a current corresponding to an exposure intensity to the sub-pixel 103 according to exposure. The sub-pixel 103 is located between the N-type main pixel 101 and the P-type main pixel 102, and is configured to generate and output a signal difference between the N-type main pixel 101 and the P-type main pixel 102 according to the current.

Figure 2:
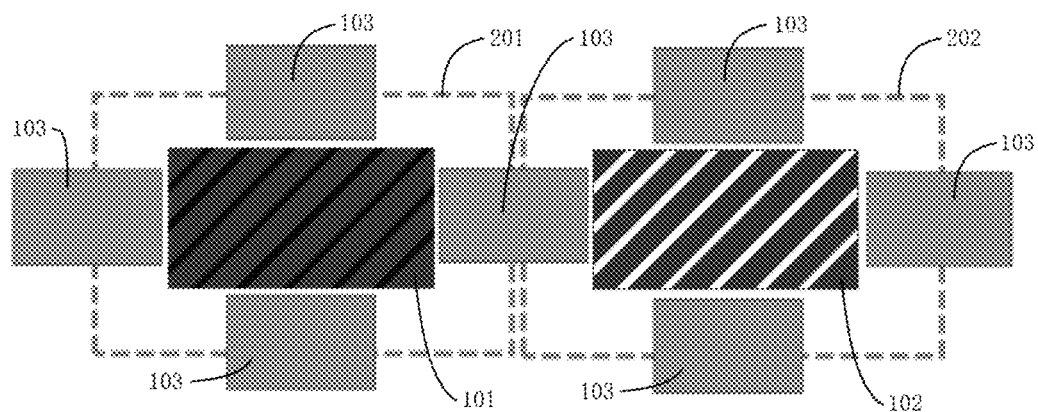
FIG. 2 is a schematic diagram of another pixel unit provided by the present application.

In a second aspect, the present application proposes a pixel unit; as shown in FIG. 2, the pixel unit includes at least a first pixel 201 and a second pixel 202 that are adjacent to each other; the first pixel 201 includes an N-type main pixel 101, and the second pixel 202 includes a P-type main pixel 102; the first pixel 201 and the second pixel 202 share one sub-pixel 103.

Both the N-type main pixel 101 and the P-type main pixel 102 are configured to output a current corresponding to an exposure intensity to the sub-pixel 103 according to exposure. The sub-pixel 103 generates and outputs a signal difference between the N-type main pixel 101 and the P-type main pixel 102 according to the current.

Figure 3:
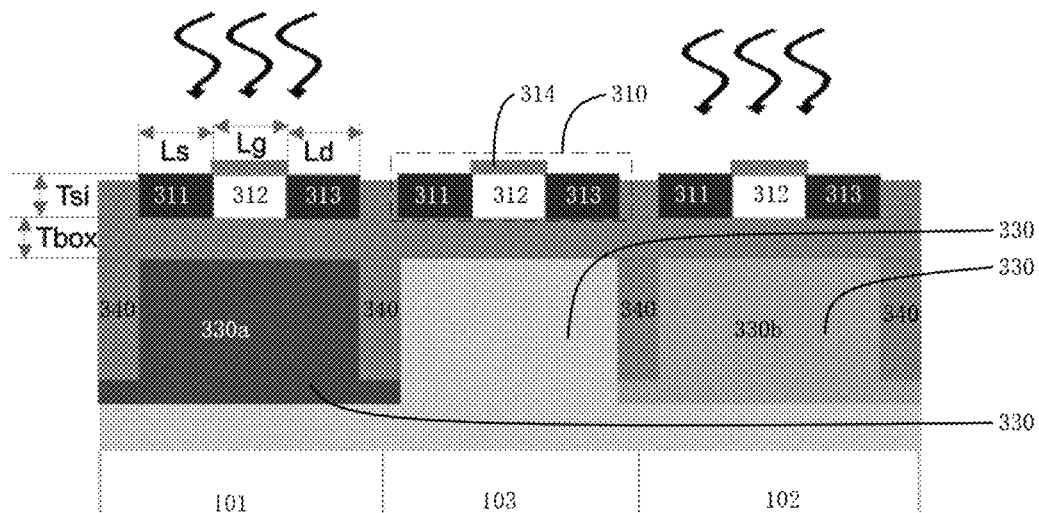
FIG. 3 is a schematic structural diagram of a signal processing method for a pixel unit provided by the present application.

As shown in FIG. 3, the N-type main pixel 101, the P-type main pixel 102 and the sub-pixel 103 all include an N-type MOS transistor structure 310, a buried oxide layer 320 and a substrate 330.

The N-type MOS transistor structure 310 includes: an N-type MOS transistor source region 311, an N-type MOS transistor channel region 312, and an N-type MOS transistor drain region 313.

A thickness (Tsi) of a silicon film in the N-type MOS transistor channel region 312 is 5 nanometers to 20 nanometers. A length (Ls) of the N-type MOS transistor source region 311 is 20 nanometers to 90 nanometers. A length (Ld) of the N-type MOS transistor drain region 313 is 20 nanometers to 90 nanometers. A thickness (Tbox) of the buried oxide layer 320 is 10 nanometers to 30 nanometers. A length (Lg) of the N-type MOS transistor channel region 312 is 20 nanometers to 100 nanometers.

The substrate in the N-type main pixel 101 is an N-type doped well 330a, and the substrate in the P-type main pixel 102 is a P-type doped well 330b.

Shallow trench isolation 340 is used for isolation between the N-type main pixel 101, the P-type main pixel 102, and the sub-pixel 103.

The main pixels are configured to expose and convert light signals into electrical signals, and save original image signals. The sub-pixel is configured to generate and store a result after calculation of the image signals. The main pixels are divided into a N-type main pixel and a P-type main pixel. A signal voltage of the N-type main pixel increases after the exposure, and a signal voltage of the P-type main pixel decreases after the exposure. The signals generated by the two main pixels are coupled to the middle sub-pixel, and a difference between the signals of the two main pixels can be obtained in the sub-pixel. Through different pixel arrangement and exposure timing, this structure can realize the difference calculation of the pixel signals in space and time.

As shown in FIG. 2, the two adjacent pixels contain different types of main pixels. After the exposure, the signal difference of the adjacent pixels can be obtained in the sub-pixel located between the two main pixels. As shown in FIG. 1, one pixel contains two main pixels and one sub-pixel. The two main pixels are respectively exposed in two consecutive frames, and the signal difference of the pixels in the two consecutive frames can be obtained in the sub-pixel. The pixel signal difference in space and time has to be calculated in advance in many image processing algorithms. In this pixel structure, the result of the difference calculation can be obtained at the same time as the original signals are generated, which improves the operational efficiency.

The N-type main pixel, the P-type main pixel, and the sub-pixel in the embodiment of the present application can be implemented using traditional cmos pixels or other new types of pixels. The arrangement and exposure timing of the main pixels and the sub-pixel can be adjusted according to different requirements. Each structural parameter in the pixel can be adjusted separately. The main pixel can be exposed in the form of backlight illumination. By using the basic structure and photoelectric characteristics of the pixel, light-sensing, signal storage and instant calculation in the pixel are completed in the pixel, the delay and resource consumption of image processing can be effectively reduced, and the image processing efficiency can be improved.

Figure 4:
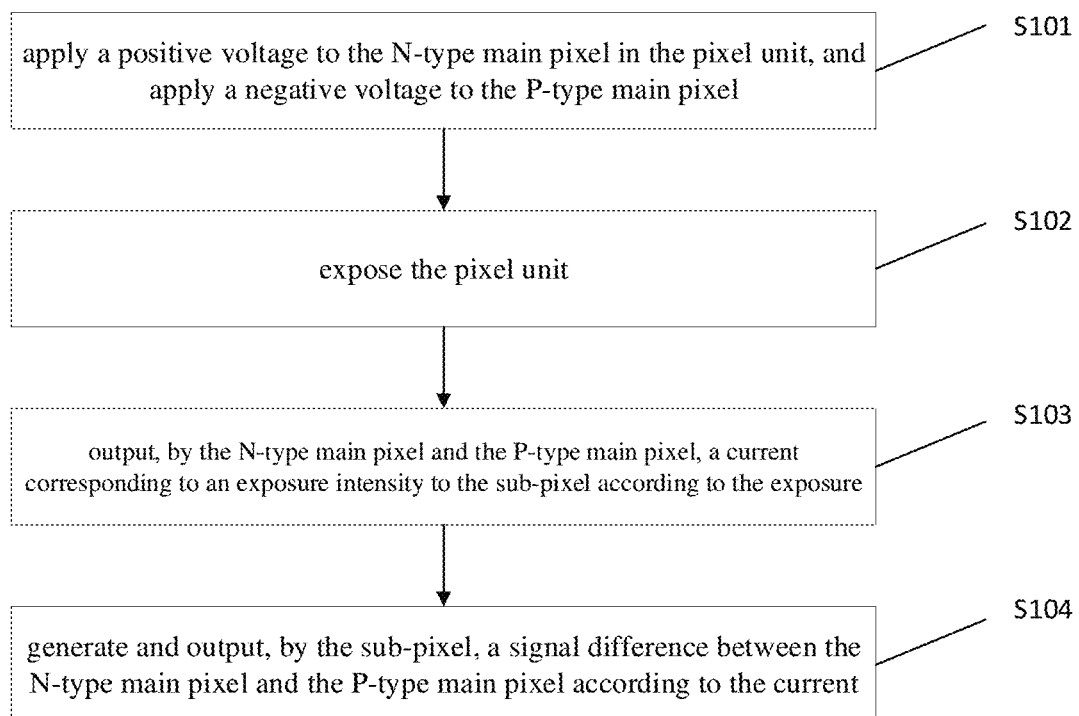
FIG. 4 is a schematic layout diagram showing steps of the signal processing method for the pixel unit provided by the present application.

In a third aspect, the present application proposes a signal processing method for a pixel unit; as shown in FIG. 4, the method includes the following steps:

S101: applying a positive voltage to the N-type main pixel in the pixel unit, and applying a negative voltage to the P-type main pixel;

S102: exposing the pixel unit;

S103: outputting, by the N-type main pixel and the P-type main pixel, a current corresponding to an exposure intensity to the sub-pixel according to the exposure; and S104: generating and outputting, by the sub-pixel, a signal difference between the N-type main pixel and the P-type main pixel according to the current.

The photoelectric signal processing method of the embodiment of the present application is mainly divided into three processes of resetting, collecting, and reading. The corresponding electrode bias conditions are shown in Table 1.

TABLE 1

|  | reset | collecting | reading |
|---|---|---|---|
| NMOS transistor gate voltage | 0 | 0 | +Vdd |
| NMOS transistor drain voltage | 0 | 0 | +Vdd |
| NMOS transistor source voltage | 0 | 0 | 0 |
| N-type doped region voltage | −Vreset | +Vdd | +Vdd |
| P-type doped region voltage | +Vreset | −Vdd | −Vdd |

As shown in Table 1 and FIG. 3, in the resetting phase, the source, drain and gate voltages of the MOS transistor are zero, making the MOS transistor in an off state. A reset pulse signal Vreset (a reset signal) is applied to a N end (N-type doped region) of the PN junction, the PN junction is forward biased, and a forward bias current injects charges into the floating P-type doped region and resets the P end (P-type doped region) voltage to the initial voltage. The voltages of the N-type MOS transistor source region 311, the N-type MOS transistor channel region 312 and the N-type MOS transistor drain region 313 are all zero, making the N-type MOS in the off state. The P-type doped well 330b and the N-type doped well 330a are respectively applied with reset pulse signals +Vreset and −Vreset to reset the voltages in the wells to the initial voltage.

In the collecting phase, a negative voltage −Vdd is applied to the P-type doped well 330b, and a positive voltage +Vdd is applied to the N-type doped well 330a, resulting in a depletion region in the doped well near the buried oxide layer 320. The incident light produces photogenerated carriers in the doped wells, and the photogenerated carriers are collected under the action of the electric field in the depletion region. The direction of the electric field in the depletion region of the P-type doped well 330b is downward, photogenerated electrons are collected, and the potential of the P-type doped well 330b lowers after light is irradiated. The direction of the electric field in the depletion region of the N-type doped well 330a is upward, photogenerated holes are collected, and the potential of the N-type doped well 330a rises after light is irradiated. The sub-pixel 103 is located in the middle of the two main pixels. The signals of the two adjacent main pixels will be coupled to the sub-pixel 103. Since the signal voltages of the two main pixels change in opposite directions after light irradiation, partial signals will cancel each other after being coupled to the sub-pixel 103. Thus, the difference between the signals of the two main pixels is obtained in the sub-pixel 103.

In the reading phase, an optical signal is read by the current of a drain electrode on the N-type MOS transistor drain region 313 above the buried oxide layer 320. The drain electrode on the N-type MOS transistor drain region 313 and a gate electrode on a gate oxide layer 314 of the N-type MOS transistor are both set at the positive voltage +Vdd. The photogenerated carriers accumulated under the buried oxide layer 320 will change the potential at the interface between the buried oxide layer 320 and the substrate 330, and will act on the N-type MOS transistor channel region 312 above through the buried oxide layer 320 to change a threshold voltage of the N-type MOS transistor channel. For the N-type main pixel 101, the threshold voltage decreases after light irradiation, and the current of the drain (the drain region 313) increases. For the P-type main pixel 102, the threshold voltage increases after light irradiation, and the current of the drain (the drain region 313) decreases. For the sub-pixel 103, when the light intensity of the N-type main pixel 101 is greater than the light intensity of the P-type main pixel 102, the threshold voltage decreases, and the current of the drain (the drain region 313) increases; and when the light intensity of the N-type main pixel 101 is less than the light intensity of the P-type main pixel 102, the threshold voltage increases, and the current of the drain (the drain region 313) decreases. The light intensity can be evaluated by measuring the current in the drain region of the main pixel, and the signal difference between the two main pixels can be obtained by measuring the current of the drain (the drain region 313) in the sub-pixel 103.

Figure 5:
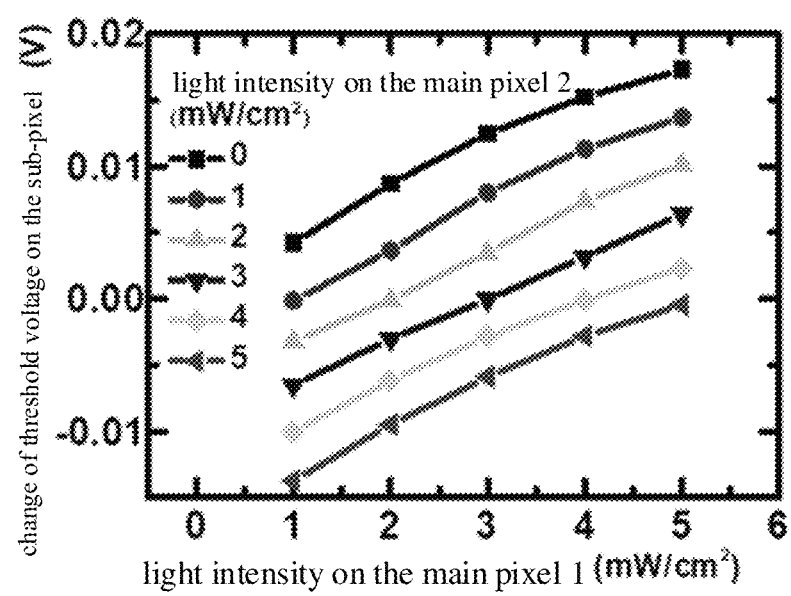
FIG. 5 is a graph of threshold voltage change of a sub-pixel of the pixel unit provided by the present application.

FIG. 5 shows threshold voltage change of the N-type MOS transistor structure 310 in the sub-pixel 103 under different exposure intensities of two adjacent main pixels. The light intensities of the main pixel 2 on different lines are different. The light intensity of the main pixel 2 on line 0 is 0, the light intensity of the main pixel 2 on line 1 is 1, the light intensity of the main pixel 2 on line 2 is 2, the light intensity of the main pixel 2 on line 3 is 3, the light intensity of the main pixel 2 on line 4 is 4, and the light intensity of the main pixel 2 on line 5 is 5. The change of the threshold voltage reflects the difference between the light intensities of the main pixel 1 and the main pixel 2, so when the light intensity of the main pixel 2 increases, the curves will translate downward.

The embodiment of the application proposes a basic pixel structure of integrated image sensing and computing, in which the main pixels and the sub-pixel are combined. The pixel working mechanism is to generate calculation results through the coupling of different types of main pixel signals, and efficient preprocessing of the images is achieved by using the basic characteristics of pixels.

In the embodiment of the present application, by adding a sub-pixel between two main pixels, the sub-pixel generates and outputs the signal difference between the N-type main pixel and the P-type main pixel according to the current sent by the two main pixels, so that the received signal can be efficiently processed directly to reduce the amount of output data. Since there is no need to increase a circuit, the pixel area will not increase due to a complicated circuit. The main pixels and the sub-pixel in the embodiment of the present application are both basic pixel structures, so that the complete pixel structures are preserved while realizing the calculation function, and compromise of the imaging quality and pixel area is avoided. By using the basic physical characteristics of the pixels to generate the calculation result instead of using a functional circuit, the calculation result is generated at the same time as the original signals, and there is no calculation delay compared with a calculation circuit. The original information of the image and the result after calculation are respectively stored in the main pixels and the sub-pixel, and the calculation result can be generated without losing the original information of the image.

Described above are only preferred specific embodiments of the present application, but the scope of protection of the present application is not limited thereto. Any change or replacement that can be easily conceived by those skilled in the art within the technical scope disclosed in the present application shall be covered within the scope of protection of the present application. Therefore, the scope of protection of the present application shall be subject to the scope of protection of the claims.

The invention claimed is:

1. A pixel unit comprising:
at least one pixel comprising an N-type main pixel, a P-type main pixel, and a sub-pixel,
wherein:
both the N-type main pixel and the P-type main pixel are configured to output a current corresponding to an exposure intensity to the sub-pixel according to exposure; and
the sub-pixel is located between the N-type main pixel and the P-type main pixel, and is configured to generate and output a signal difference between the N-type main pixel and the P-type main pixel according to the current, and
wherein the N-type main pixel, the P-type main pixel and the sub-pixel all comprise an N-type MOS transistor structure, a buried oxide layer and a substrate.

2. The pixel unit according to claim 1, wherein the N-type MOS transistor structure comprises: an N-type MOS transistor source region, an N-type MOS transistor channel region, and an N-type MOS transistor drain region.

3. The pixel unit according to claim 2, wherein a thickness of a silicon film in the N-type MOS transistor channel region is 5 nanometers to 20 nanometers.

4. The pixel unit according to claim 2, wherein lengths of the N-type MOS transistor source region and the N-type MOS transistor drain region are 20 nanometers to 90 nanometers.

5. The pixel unit according to claim 1, wherein a thickness of the buried oxide layer is 10 nanometers to 30 nanometers.

6. The pixel unit according to claim 1, wherein the substrate in the N-type main pixel is an N-type doped well, and the substrate in the P-type main pixel is a P-type doped well.

7. The pixel unit according to claim 1, wherein shallow trench isolation is used for isolation between the N-type main pixel, the P-type main pixel and the sub-pixel.

8. A pixel unit comprising:
at least a first pixel and a second pixel that are adjacent to each other, the first pixel comprising an N-type main pixel, the second pixel comprising a P-type main pixel, and the first pixel and the second pixel sharing one sub-pixel,
wherein:
both the N-type main pixel and the P-type main pixel are configured to output a current corresponding to an exposure intensity to the sub-pixel according to exposure; and
the sub-pixel is configured to generate and output a signal difference between the N-type main pixel and the P-type main pixel according to the current, and
wherein the N-type main pixel, the P-type main pixel and the sub-pixel all comprise an N-type MOS transistor structure, a buried oxide layer and a substrate.

9. The pixel unit according to claim 8, wherein the N-type MOS transistor structure comprises: an N-type MOS transistor source region, an N-type MOS transistor channel region, and an N-type MOS transistor drain region.

10. The pixel unit according to claim 9, wherein a thickness of a silicon film in the N-type MOS transistor channel region is 5 nanometers to 20 nanometers.

11. The pixel unit according to claim 9, wherein lengths of the N-type MOS transistor source region and the N-type MOS transistor drain region are 20 nanometers to 90 nanometers.

12. The pixel unit according to claim 8, wherein a thickness of the buried oxide layer is 10 nanometers to 30 nanometers.

13. The pixel unit according to claim 8, wherein the substrate in the N-type main pixel is an N-type doped well, and the substrate in the P-type main pixel is a P-type doped well.

14. The pixel unit according to claim 8, wherein shallow trench isolation is used for isolation between the N-type main pixel, the P-type main pixel and the sub-pixel.

15. A signal processing method for a pixel unit, in which the pixel unit according to claim 1 is used, the method comprising the following steps:
applying a positive voltage to the N-type main pixel in the pixel unit, and applying a negative voltage to the P-type main pixel;
exposing the pixel unit;
outputting, by the N-type main pixel and the P-type main pixel, a current corresponding to an exposure intensity to the sub-pixel according to the exposure; and
generating and outputting, by the sub-pixel, a signal difference between the N-type main pixel and the P-type main pixel according to the current.

16. A signal processing method for a pixel unit, in which the pixel unit according to claim 8 is used, the method comprising the following steps:
applying a positive voltage to the N-type main pixel in the pixel unit, and applying a negative voltage to the P-type main pixel;
exposing the pixel unit;
outputting, by the N-type main pixel and the P-type main pixel, a current corresponding to an exposure intensity to the sub-pixel according to the exposure; and
generating and outputting, by the sub-pixel, a signal difference between the N-type main pixel and the P-type main pixel according to the current.

* * * * *